US009812629B2

(12) United States Patent
Hsu et al.

(10) Patent No.: US 9,812,629 B2
(45) Date of Patent: Nov. 7, 2017

(54) THERMOELECTRIC CONVERSION STRUCTURE AND ITS USE IN HEAT DISSIPATION DEVICE

(71) Applicant: INDUSTRIAL TECHNOLOGY RESEARCH INSTITUTE, Hsinchu (TW)

(72) Inventors: Hsiao-Hsuan Hsu, Taipei (TW); Chun-Hu Cheng, Tainan (TW); Ya-Wen Chou, Zhubei (TW); Yu-Li Lin, Chiayi (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 613 days.

(21) Appl. No.: 13/846,211

(22) Filed: Mar. 18, 2013

(65) Prior Publication Data

US 2014/0014152 A1 Jan. 16, 2014

(30) Foreign Application Priority Data

Jul. 13, 2012 (TW) ............................ 101125414 A
Nov. 23, 2012 (TW) ............................ 101144037 A

(51) Int. Cl.
*H01L 35/30* (2006.01)
*H01L 35/08* (2006.01)
*B82Y 30/00* (2011.01)

(52) U.S. Cl.
CPC .............. *H01L 35/30* (2013.01); *H01L 35/08* (2013.01); *B82Y 30/00* (2013.01); *Y10S 977/734* (2013.01);
(Continued)

(58) Field of Classification Search
CPC ...... H01L 35/30; H01L 35/08; Y10S 977/742; Y10S 977/734; B82Y 30/00
(Continued)

(56) References Cited

U.S. PATENT DOCUMENTS 3,859,143 A * 1/1975 Krebs .................... H01L 35/16 136/205
6,608,250 B2 8/2003 Ghoshal
(Continued)

FOREIGN PATENT DOCUMENTS

CN 1822354 A 8/2006
CN 1926695 A 3/2007
(Continued)

OTHER PUBLICATIONS

Cahill, "Heat Transport in Dielectric Thin Films and at Solid-Solid Interfaces", Microscale Thermophysical Engineering, pp. 85-109, Oct. 29, 2010.
(Continued)

*Primary Examiner* — Keith Hendricks
*Assistant Examiner* — Kourtney S Carlson
(74) *Attorney, Agent, or Firm* — Nixon Peabody LLP

(57) ABSTRACT

The disclosure provides a thermoelectric conversion structure and its use in heat dissipation device. The thermoelectric conversion structure includes a thermoelectric element, a first electrode and an electrically conductive heat-blocking layer. The thermoelectric element includes a first end and a second end opposite to each other. The first electrode is located at the first end of the thermoelectric element. The electrically conductive heat-blocking layer is between the thermoelectric element and the first electrode.

18 Claims, 7 Drawing Sheets

32
33a
24
25a
25
262
212
26
21
20
261
211
22a
23a
23
22
33
31

(52) U.S. Cl.
CPC ........ *Y10S 977/742* (2013.01); *Y10S 977/762* (2013.01)

(58) Field of Classification Search
USPC .................. 136/200–240; 977/742, 734, 762
See application file for complete search history.

(56) References Cited

U.S. PATENT DOCUMENTS

| | | | |
|---|---|---|---|
| 6,740,600 | B2 | 5/2004 | Ghoshal et al. |
| 6,812,395 | B2 * | 11/2004 | Bell ........................ H01L 35/34 136/201 |
| 7,342,169 | B2 | 3/2008 | Venkatasubramanian et al. |
| 7,679,203 | B2 | 3/2010 | Bharathan et al. |
| 7,696,668 | B2 | 4/2010 | Hu |
| 8,063,298 | B2 | 11/2011 | Koester et al. |
| 2003/0038344 | A1 * | 2/2003 | Palmer ............. H01L 21/76898 257/621 |
| 2003/0099279 | A1 | 5/2003 | Venkatasubramanian et al. |
| 2005/0016575 | A1 | 1/2005 | Kumar et al. |
| 2005/0150535 | A1 | 7/2005 | Samavedam et al. |
| 2007/0068566 | A1 * | 3/2007 | Asatani ................... H01L 35/32 136/230 |
| 2007/0069357 | A1 | 3/2007 | Weaver et al. |
| 2007/0277866 | A1 * | 12/2007 | Sander .................... H01L 35/34 136/230 |
| 2008/0017237 | A1 | 1/2008 | Bray et al. |
| 2008/0060693 | A1 * | 3/2008 | Sterzel .................... H01L 35/08 136/203 |
| 2008/0210285 | A1 | 9/2008 | Hosono et al. |
| 2010/0126547 | A1 | 5/2010 | Gromov et al. |
| 2011/0017254 | A1 * | 1/2011 | Stefan ................ B23K 35/3006 136/230 |
| 2011/0139207 | A1 | 6/2011 | Edwards |
| 2011/0220165 | A1 | 9/2011 | Lee et al. |
| 2011/0253187 | A1 | 10/2011 | Ohta et al. |

FOREIGN PATENT DOCUMENTS

| | | | |
|---|---|---|---|
| CN | 1992240 | A | 7/2007 |
| CN | 101978517 | A | 2/2011 |
| TW | 201127966 | A | 8/2011 |
| WO | WO-9517020 | A1 | 6/1995 |

OTHER PUBLICATIONS

Chowdhury et al., "On-chip cooling by superlattice-based thin-film thermoelectrics", Nature Nanotechnology, vol. 4, pp. 235-238, Apr. 2009.

Ju et al., "Study of interface effects in thermoelectric microrefrigerators", Journal of Applied Physics, vol. 88, No. 7, pp. 4135-4130, Oct. 1, 2000.

Min et al., "Cooling performance of integrated thermoelectric microcooler", Solid-State Electronics, vol. 43, pp. 923-929, 1999.

Silva et al., "Micro-thermoelectric cooler: interfacial effects on thermal and electrical transport ", International Journal of Heat and Mass Transfer. vol. 47, pp. 2417-2435, 2004.

Zhang et al., "On-Chip High Speed Localized Cooling Using Superlattice Microrefrigerators", IEEE Transactions on Components and Packaging Technologies, vol. 29, No. 2, pp. 395-401, Jun. 2006.

Prasher, "Graphene Spreads the Heat", Science, vol. 328, No. 185, pp. 185-186, 2010.

Yang et al., "Thermal and electrical characterization of CuÕCoFe superlattices", Applied Physics Letters vol. 84, No. 16, pp. 3121-3123, Apr. 19, 2004.

Taiwan Patent Office, Office Action, Patent Application Serial No. TW101144037, dated Dec. 23, 2014, Taiwan.

Kucherov et al., "Importance of barrier layers in thermal diodes for energy conversion", J. Appl. Phys. Lett. 97, 2005, pp. 094902, Fig 1-2.

Kucherov et al., Importance of barrier layers in thermal diodes for energy conversion, Journal of Applied Physics 97, 094902 (2005), pp. 1-8.

* cited by examiner

THERMOELECTRIC CONVERSION STRUCTURE AND ITS USE IN HEAT DISSIPATION DEVICE

CROSS-REFERENCE TO RELATED APPLICATIONS

This non-provisional application claims priority under 35 U.S.C. §119(a) on patent application No(s). 101125414 filed in Taiwan, R.O.C. on Jul. 13, 2012 and patent application 101144037 filed in Taiwan, R.O.C. on Nov. 23, 2012, the entire contents of which are hereby incorporated by reference.

TECHNICAL FIELD

The disclosure relates to a heat dissipation device, and more specifically, a heat dissipation device including a thermoelectric conversion structure.

BACKGROUND

In thermal management for objects, the methods for heat dissipation using mechanical fans, heat pipes or finned heat sink are inefficient and can only reduce the objects to the temperature which is not lower than room temperature.

Thus, manufacturers develop a thermoelectric device utilizing Peltier effect to automatically drive the transfer of heat in a certain direction. The theory, also known as the Peltier effect, is to create a heat difference from a voltage, by a current passing through two different metals connected to each other at two junctions. The current causes a heat transfer from one junction to the other where one cools off while the other heats up. The flowing of the electric current may carry away the heat of the objects and thus the junction which absorbs the heat may be cooled down to go below the room temperature. The heat flux Q, heat absorbed by the junction per unit time, is equal to: $Q=\Pi I$ where $\Pi$ is the Peltier coefficient; I is the applied current.

An operating electronic device is placed next to the thermoelectric device and the heat of the electronic device is absorbed by the thermoelectric device so that the electronic device may be cooled off. Such thermoelectric device is quiet when operating, without moving mechanical parts, highly reliable, and can be integrated with semiconductor process. Therefore, the thermoelectric device is applied to cool electronic and photoelectric devices. In addition, the thermoelectric device using the Peltier effect in thermal management can accommodate appliances such as portable refrigerators, pocket-size thermo cups, and portable dehumidifiers limited in compact configuration, for better operations thereof.

The thermoelectric device configured to utilize the Peltier effect is generally formed of an array of P and N-type thermoelectric elements. The P and N-type thermoelectric elements are connected electrically to each other in series and thermally in parallel together, so thermal and electrical resistances occur at the junction of the metal electrode and thermoelectric elements. With reducing thermoelectric element thickness, the interfacial contact resistance becomes a key factor that can modulate the performance of the thermoelectric device significantly. The electrical resistance cause joule heat and the thermal resistance make heat backflow worsened, so that the heat-dissipating efficiency of the thermoelectric device is reduced.

SUMMARY

A thermoelectric conversion structure comprises a thermoelectric element, a first electrode and an electrically conductive heat-blocking layer. The thermoelectric element includes a first end and a second end opposite to each other. The first electrode is located at the first end of the thermoelectric element. The electrically conductive heat-blocking layer is between the thermoelectric element and the first electrode.

A heat dissipation device comprises at least one first thermoelectric element, at least one second thermoelectric element, at least two first electrodes, at least one second electrode and a plurality of electrically conductive heat-blocking layers. The at least one first thermoelectric element has a first endothermic end and a first exothermic end which are opposite to each other. The at least one second thermoelectric element has a second endothermic end and a second exothermic end which are opposite to each other. One of the at least two first electrodes is connected to the first endothermic end, and another one of the at least two first electrodes is connected to the second endothermic end. The at least one second electrode is connected to the at least one first exothermic end and the at least one second exothermic end. The plurality of electrically conductive heat-blocking layers are between the first thermoelectric element and the one of the at least two first electrodes as well as the second thermoelectric element and the another one of the at least two first electrodes, respectively.

BRIEF DESCRIPTION OF THE DRAWINGS

The disclosure will become more fully understood from the detailed description given herein below for illustration only, and thus does not limit the disclosure, and wherein.

DETAILED DESCRIPTION

Figure 1:
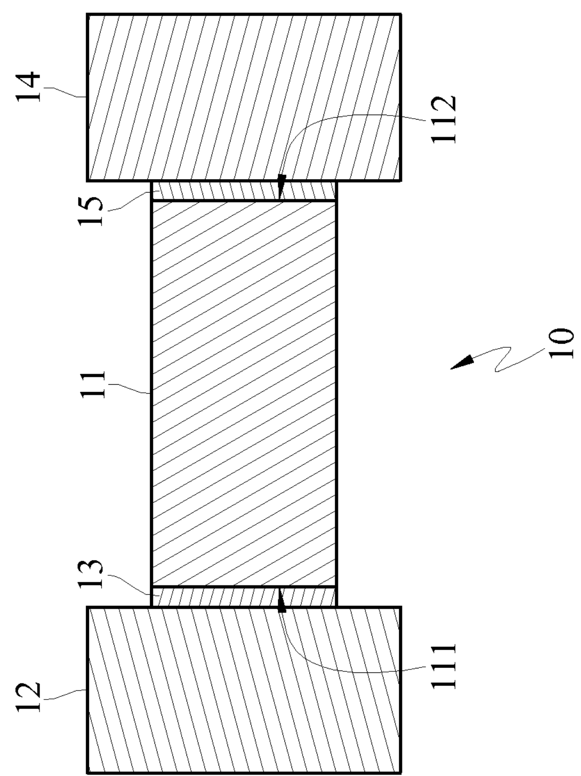
FIG. 1 is a cross-sectional view of a thermoelectric conversion structure according to an embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a cross-sectional view of a thermoelectric conversion structure in an embodiment according to the disclosure. The thermoelectric conversion structure 10 of the disclosure comprises a thermoelectric element 11, a first electrode 12 and an electrically conductive heat-blocking layer 13. The thermoelectric conversion structure 10 further comprises a second electrode 14 and an electrically conductive heat-dissipating layer 15. The thermoelectric element 11 has a first end 111 and a second end 112 which are opposite to each other. The first electrode 12 is located at the first end 111 of the thermoelectric element 11. The electrically conductive heat-blocking layer 13 is between the thermoelectric element 11 and the first electrode 12. Electron and hole carriers, but no phonons, tunneling through the electrically conductive heat-blocking layer 13. In other words, the phonons are blocked by the electrically conductive heat-blocking layer 13. Thus, the flowing of the carriers (the electron and the hole) may not be affected because the electron and the hole may tunnel through the electrically conductive heat-blocking layer 13. The size effect is found when the thickness of the electrically conductive heat-blocking layer 13 is less than or close to the phonon mean free path. The phonons are scattered more frequently and obviously due to the size effect and the mismatched interface of the different materials. Therefore the effective thermal conductivity of the electrically conductive heat-blocking layer 13 and overall thermal conductivity of the thermoelectric conversion structure 10 are reduced.

In the embodiment of the disclosure, the second electrode 14 is positioned at the second end 112 of the thermoelectric element 11. The electrically conductive heat-dissipating layer 15, between the thermoelectric element 11 and the second electrode 14, enables the electrons and the phonons to pass through itself. In addition, the first electrode 12 is adapted for being in thermal contact with a heat source (not shown), and the second electrode 14 is adapted for being in thermal contact with a heat sink (not shown). Therefore, the first end 111 of the thermoelectric element 11 is an endothermic end, and the second end 112 of the thermoelectric element 11 is an exothermic end.

In the embodiment of the disclosure, the thermoelectric element 11 may be made of N-type semiconductors or P-type semiconductors materials, but not limited to the embodiment. The materials of the first electrode 12 and the second electrode 14 are selected from a group consisting of platinum, gold, nickel, palladium, copper, aluminum, silver, titanium, tantalum, tungsten, molybdenum, chromium, cobalt, iron, zirconium, hathium, vanadium, iridium, platinum alloys, gold alloys, nickel alloys, palladium alloys, copper alloys, aluminum alloys, silver alloys, titanium alloys, tantalum alloys, tungsten alloys, molybdenum alloys, chromium alloys, cobalt alloys, ferroalloys, zirconium alloys, hafnium alloys, vanadium alloys, iridium alloys and combinations thereof, but not limited to the disclosure. Methods for producing the first electrode 12 and the second electrode 14 in the embodiment are physical vapor deposition (PVD), chemical vapor deposition (CVD), atomic layer deposition (ALD) or plating, but not limited to the disclosure.

In the embodiment of the disclosure, the material of the electrically conductive heat-dissipating layer 15, whose thickness is less than 100 nanometers (nm), may be selected from a group consisting of graphene, carbon nanotube, carbon nanowire and combinations thereof, but not limited to the disclosure. Moreover, the material of the electrically conductive heat-dissipating layer 15 may even be single-layer graphene. Methods for producing the electrically conductive heat-dissipating layer 15 in the embodiment are CVD, mechanical exfoliation method, epitaxial growth method, and chemical reduction method of graphene oxide, but not limited to the disclosure.

In the embodiment of the disclosure, the thickness of the electrically conductive heat-blocking layer 13 remains within the range of which the electrons are able to tunnel through in order to maintain the electrical conductivity of the thermoelectric conversion structure 10. Moreover, when the thickness of the electrically conductive heat-blocking layer 13 is less than or close to the phonon mean free path, the phonons are scattered at the interfaces of the electrically conductive heat-blocking layer 13. Therefore the overall thermal conductivity of the thermoelectric conversion structure 10 is reduced. The methods for the growth of the electrically conductive heat-blocking layer 13 may be ALD, CVD or PVD, but not limited to the disclosure.

Figure 2A:
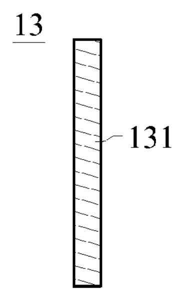
FIG. 2A is a cross-sectional view of an electrically conductive heat-blocking layer in FIG. 1.

Please refer to FIG. 2A, which is a cross-sectional view of an electrically conductive heat-blocking layer in FIG. 1. In this embodiment, the electrically conductive heat-blocking layer 13 has a first sublayer 131, but not limited to the disclosure. The material of the sublayer 131 is selected from a group consisting of oxides, metal oxides, nitrides, oxynitrides, metal nitride oxides, carbides, carbon oxides and combinations thereof. The thickness of the first sublayer 131 may be less than 10 nm.

Figure 2B:
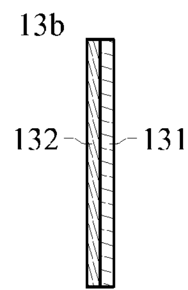
FIG. 2B is a cross-sectional view of an electrically conductive heat-blocking layer according to another embodiment of the disclosure.

In other embodiments, an electrically conductive heat-blocking layer comprises a plurality of sublayers made of dissimilar or identical materials which are overlapped to each other. Please refer to FIG. 2B, which depicts a cross-sectional view of an electrically conductive heat-blocking layer in another embodiment according to the disclosure. An electrically conductive heat-blocking layer 13*b* comprises a first sublayer 131 and a second sublayer 132, but not limited to the disclosure. The material of the first sublayer 131 is selected from a group consisting of oxides, metal oxides, nitrides, oxynitrides, metal nitride oxides, carbides, carbon oxides and combinations thereof. The thickness of the first sublayer 131 may be less than 10 nm. The material of the second sublayer 132 is selected from a group consisting of metal silicides, metal nitrides, metal nitride silicides, metal carbides, metal carbon silicides, amorphous alloys and combinations thereof. The thickness of the second sublayer 132 may be less than 100 nm. For example, the materials for the first sublayer 131 and the second sublayer 132 of the electrically conductive heat-blocking layer 13*b* are oxides and metal nitrides, respectively, but not limited to the disclosure.

Figure 2C:
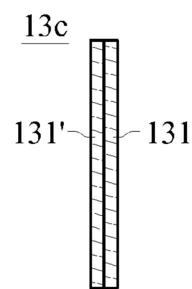
FIG. 2C is a cross-sectional view of an electrically conductive heat-blocking layer according to yet another embodiment of the disclosure.

Refer to FIG. 2C, which illustrates a cross-sectional view of an electrically conductive heat-blocking layer in yet another embodiment according to disclosure. The electrically conductive heat-blocking layer 13*c* comprises a first sublayer 131 and a first sublayer 131' whose materials are selected from a group consisting of oxides, metal oxides, nitrides, oxynitrides, metals nitride oxides, carbides, carbon oxides and combinations thereof. Otherwise, the materials chosen for the first sublayers 131, 131' may be different from each other. The combined thickness of the first sublayers 131, 131' may be less than 10 nm. One example is that the material of the first sublayer 131 is oxides, and that of the first sublayer 131' is nitrides, but not limited to the disclosure.

Figure 2D:
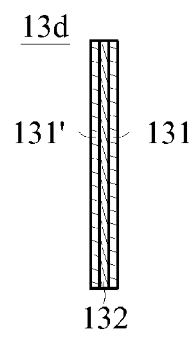
FIG. 2D is a cross-sectional view of an electrically conductive heat-blocking layer according to yet another embodiment of the disclosure.

Please refer to FIG. 2D, which depicts a cross-sectional view of an electrically conductive heat-blocking layer in yet another embodiment according to the disclosure. An electrically conductive heat-blocking layer 13*d* comprises a first sublayer 131, a second sublayer 132 and another first sublayer 131', but not limited to the disclosure. The materials of the first sublayers 131, 131' are selected from a group consisting of oxides, metal oxides, nitrides, oxynitrides, metals nitride oxides, carbides, carbon oxides and combinations thereof. The materials of the first sublayers 131, 131' may be the same, but not limited to the embodiment. In other embodiments, the materials of the first sublayers 131, 131' may be different from the other. The thickness of each of the first sublayers 131, 131' may be less than 10 nm, respectively. The material of the second sublayer 132 may be selected from a group consisting of metal silicides, metal nitrides, metal nitride silicides, metal carbides, metal carbon silicides, amorphous alloys and combinations thereof. The thickness of the second sublayer 132 may be less than 100 nm. For example, the material of the first sublayer 131, the second sublayer 132 and the first sublayer 131' are oxides, metal silicides and nitrides, respectively, but not limited to the disclosure.

Figure 3:
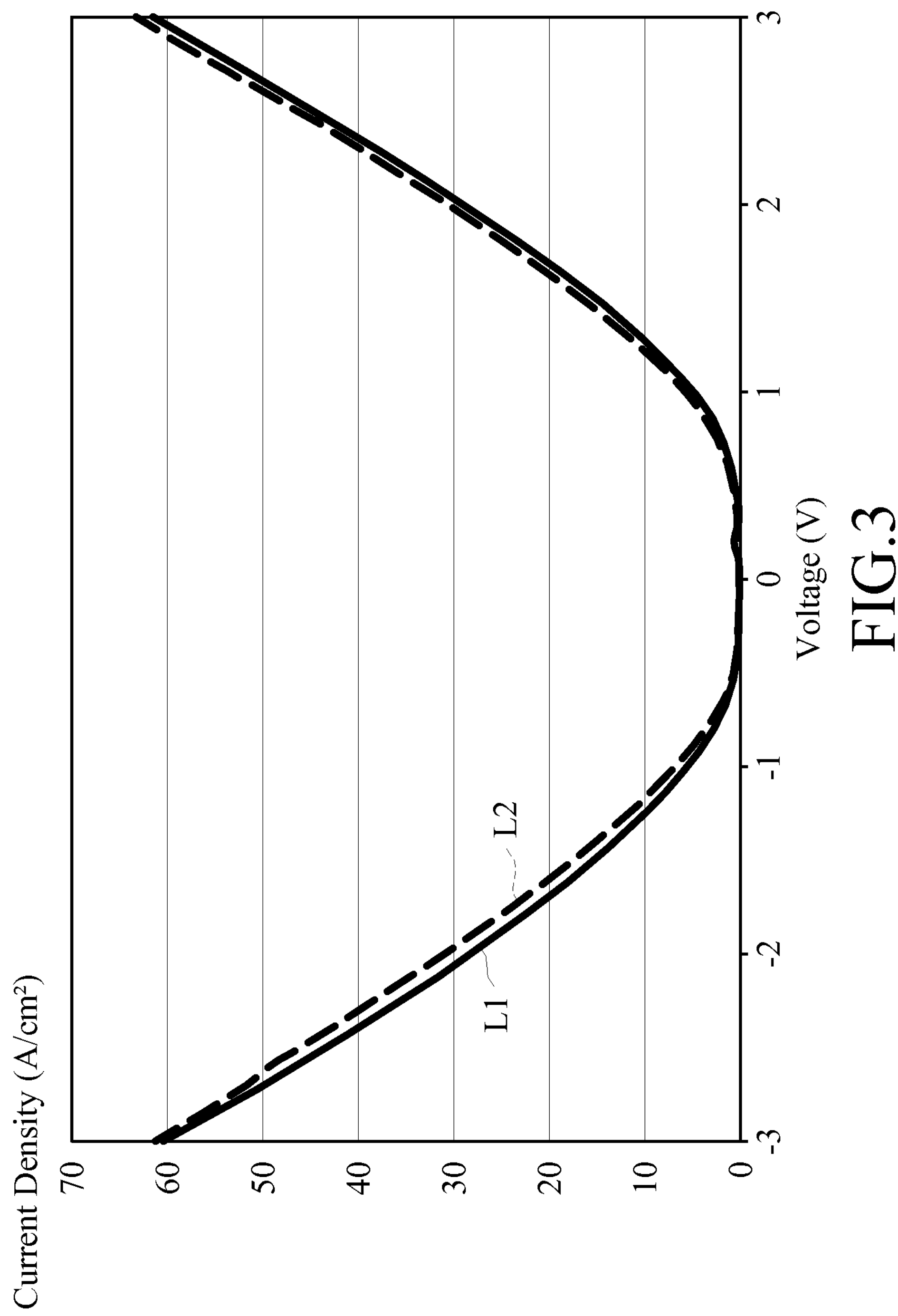
FIG. 3 is a graph with voltage on the horizontal axis and current density on the vertical axis showing two comparison curves representing a thermoelectric conversion structure with and without electrically conductive heat-blocking layer, respectively.

Please refer to FIG. 3, which is a graph with voltage on the horizontal axis and current density on the vertical axis showing two curves representing a thermoelectric conversion structure with and without electrically conductive heat-blocking layer, respectively. This experiment is to compare the electrical conductance between the different kinds of the thermoelectric conversion structure. In this experiment, a first thermoelectric conversion structure includes the first electrode 12, the electrically conductive heat-blocking layer 13, the thermoelectric element 11 and the second electrode 14 which are the same as the structures in FIG. 1. A second thermoelectric conversion structure only includes the first electrode 12, the thermoelectric element 11 and the second electrode 14. The first electrode 12 of the thermoelectric conversion structure 10 is made of nickel. The electrically conductive heat-blocking layer 13 is made of silicon dioxide ($SiO_2$) with the thickness of 2 nm. The thermoelectric element 11 is made of lead telluride (PbTe) with the thickness of 360 nm. The second electrode 14 is made of tantalum nitride (TaN) with the thickness of 100 nm. In this experiment, the thermoelectric conversion structure 10 does not include the electrically conductive heat-dissipating layer 15. In this embodiment, when different voltages are applied between the first electrode 12 and the second electrode 14 for both of the first and second thermoelectric conversion structure, the current values of both of the thermoelectric conversion structures are measured. In FIG. 3, the solid line (i.e., L1) represents the result of the first thermoelectric conversion structure with the electrically conductive heat-blocking layer 13, and the dashed line (i.e., L2) represents the result of the second thermoelectric conversion structure without the electrically conductive heat-blocking layer 13. It can be easily found that the two lines almost coincide with each other, which shows that even the electrically conductive heat-blocking layer 13 is further disposed in the thermoelectric conversion structure 10, the electrical conductivity of the thermoelectric conversion structure is barely affected.

The thermoelectric conversion efficiency is correlated to the figure of merit, ZT, which is described as the equation:

$$ZT = \frac{S^2\sigma}{\kappa}T$$

where S is the Seebeck coefficient, κ is the thermal conductivity, σ is the electrical conductivity and T is the absolute temperature.

When a thermoelectric conversion structure is configured with a high Seebeck coefficient, a high electrical conductivity and a low thermal conductivity, its thermoelectric conversion efficiency is enhanced. Generally, it is challenging to improve ZT due to a decrease in the thermal conductivity leading to simultaneous decrease in the electrical conductivity. Accordingly, the electrically conductive heat-blocking layer 13 of the disclosure is applied to maintain the electrical conductivity and lower the thermal conductivity in order to increase ZT.

Figure 4A:
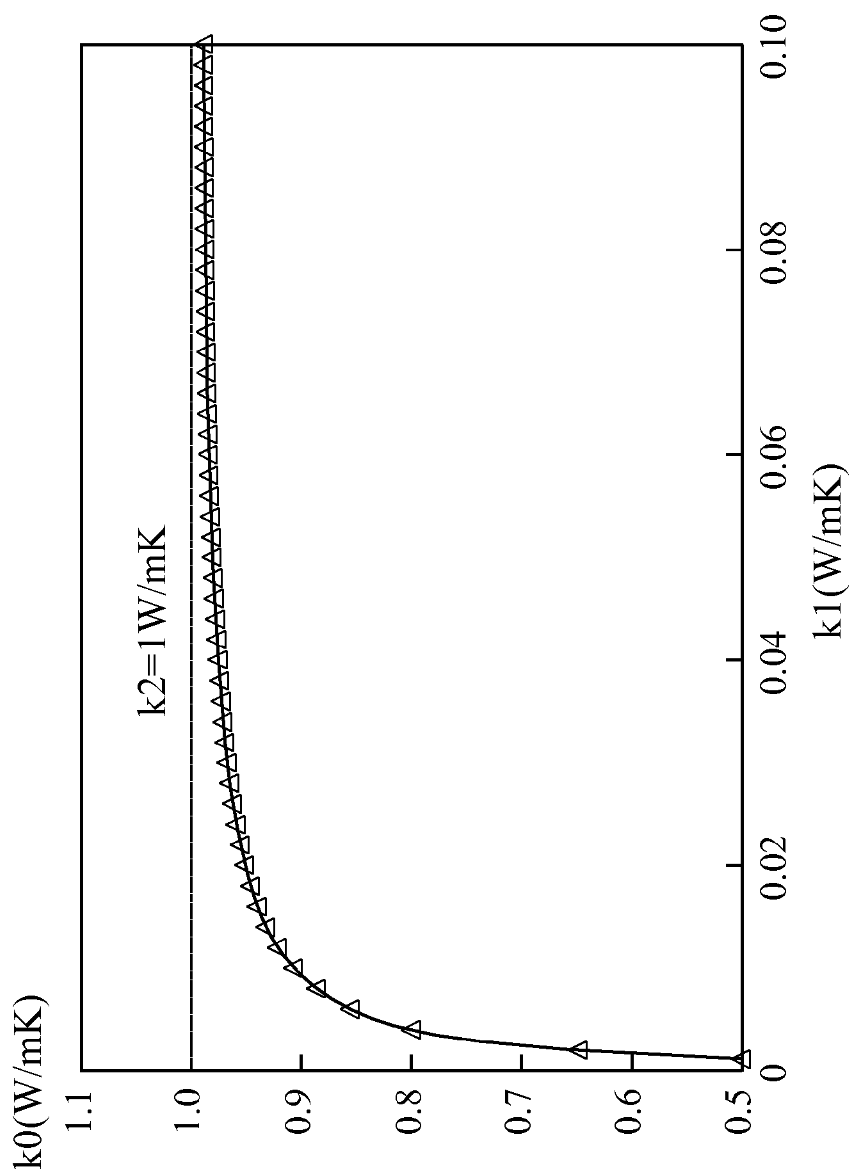
FIG. 4A is a distribution diagram of the overall thermal conductivity of the thermoelectric conversion structure as a function of the thermal conductivities of the thermoelectric element and the electrically conductive heat-blocking layer according to the disclosure.

The following example demonstrates the correlations among the overall thermal conductivity of the thermoelectric conversion structure, which correlates to the thermal conductivity of the electrically conductive heat-blocking layer 13 and the thickness ratio of thermoelectric element 11 to electrically conductive heat-blocking layer 13 of the disclosure. Please refer to FIG. 4A, which is a distribution diagram of the overall thermal conductivity of the thermoelectric conversion structure as a function of the thermal conductivities of the thermoelectric element and the electrically conductive heat-blocking layer of the disclosure. In one example, a thermoelectric element 11, made of BiTe-based thermoelectric material, is configured to be 1 micrometer (μm) in thickness, and has a thermal conductivity K2 around 1 Watt/(mete·K) (namely, W/mK). In other words, the overall thermal conductivity K0 of the thermoelectric conversion structure without the presence of the electrically conductive heat-blocking layer 13 is 1 W/mK. The thinner the nano-scaled thickness of the electrically conductive heat-blocking layer 13 is, the lower its thermal conductivity K1 is. When the thickness of the electrically conductive heat-blocking layer 13 is less than 1 nm, its thermal conductivity k1 drops to 0.01 W/mK accordingly. Moreover, in FIG. 4A, the overall thermal conductivity k0 of the thermoelectric conversion structure may be reduced from 1 to 0.91 W/mK by inserting the electrically conductive heat-blocking layer between an electrode and thermoelectric element. Therefore, the addition of the electrically conductive heat-blocking layer 13 results in the reduction of the overall thermal conductivity k0 of the thermoelectric conversion structure, which is found to be lower than the overall thermal conductivity k0 of the thermoelectric conversion structure without the electrically conductive heat-blocking layer 13. When the thickness of the electrically conductive heat-blocking layer 13 remains within the range of which the electrons are able to tunnel through without being blocked, thus the electrical conductivity of the thermoelectric conversion structure is free from being affected. As a result, the electrically conductive heat-blocking layer 13 indeed increases the figure of merit, ZT, without hindering the electrical conductivity, of the thermoelectric conversion structure of the disclosure.

Figure 4B:
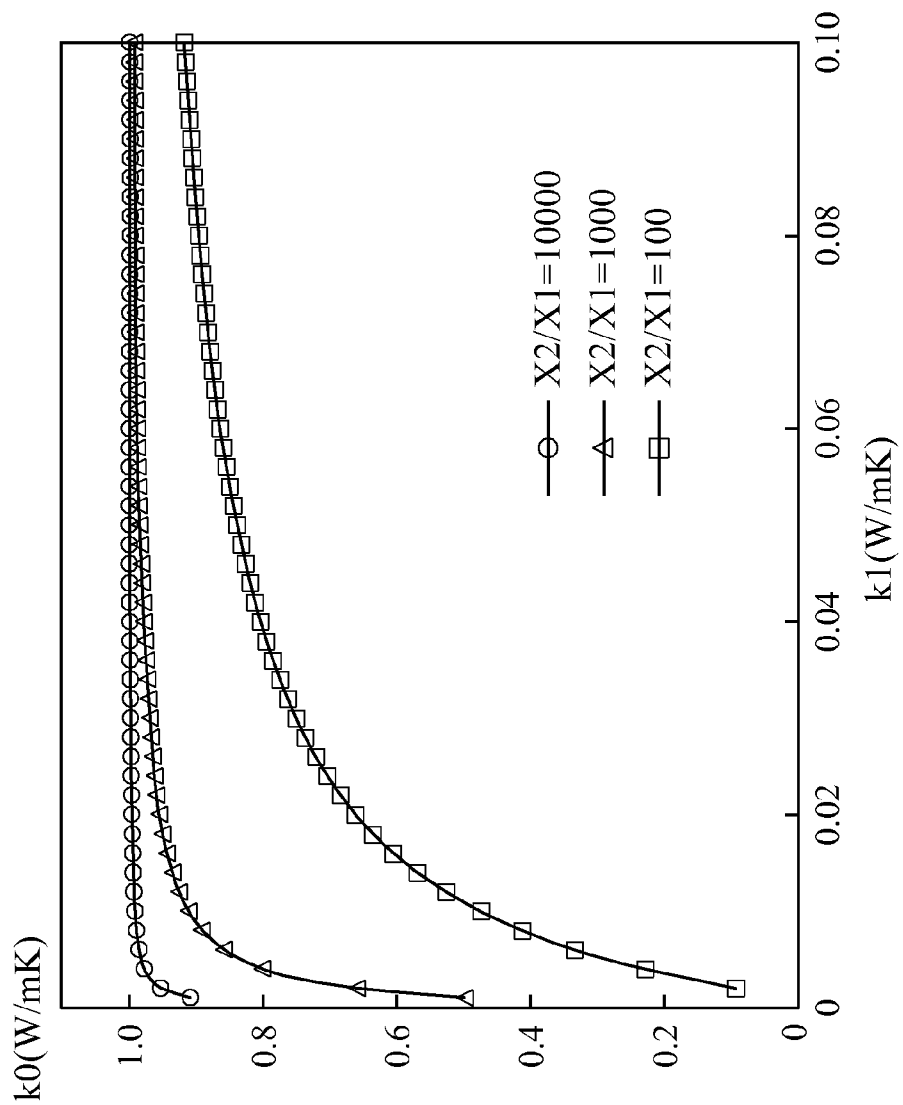
FIG. 4B is a distribution diagram of the overall thermal conductivity of the thermoelectric conversion structure versus the thickness ratio of the thermoelectric element to the electrically conductive heat-blocking layer according to the disclosure.

Please refer to FIG. 4B, which displays the relation between the distribution of the overall thermal conductivity of the thermoelectric conversion structure and the thickness ratio of the thermoelectric element to the electrically conductive heat-blocking layer according to the disclosure. The thickness of the thermoelectric element and the electrically conductive heat-blocking layer is X2 and X1, respectively.

The thickness ratio of X2 to X1 is varied from 10000 to 100. When the thickness ratio of X2 to X1 is reduced from 10000 to 1000, the overall thermal conductivity k0 of the thermoelectric conversion structure can be reduced. In other embodiments, when the thickness ratio of X2 to the X1 is reduced to 100, the overall thermal conductivity k0 of the thermoelectric conversion structure can be further reduced. When the thickness of the electrically conductive heat-blocking layer remains within the range of which the electrons are able to tunnel through it, the electrical conductivity of the thermoelectric conversion structure is not affected. Thus, lower thermal conductivity is achieved with the presence of both the thermoelectric element and the electrically conductive heat-blocking layer, compared to single thermoelectric element. Moreover, when the thickness ratio of the thermoelectric element to the electrically conductive heat-blocking layer is reduced, the overall thermal conductivity is lowered. Therefore, the disclosure increases the figure of merit ZT of the thermoelectric conversion structure by means of maintaining the electrical conductivity and reducing the thermal conductivity.

For example, in an embodiment of the disclosure, a thermoelectric element 11 is made of N-type semiconductors. A voltage difference, with a low voltage level applied to the a first electrode 12 and a high voltage level to a second electrode 14, induces a voltage drop between these two electrodes (the voltage level of the first electrode 12 is lower than that of the second electrode 14) and establishes an electric field which causes the net flow of electrons moving from the first electrode 12 to the thermoelectric element 11, then to the second electrode 14. Such an electron current, at the same time, carries heat from the first electrode 12 to the thermoelectric element 11, then to the second electrode 14 accordingly. Consequently, heat generated by a heat source is transferred by the electron current from the first electrode 12 to the thermoelectric element 11, continuing moving to the second electrode 14, and eventually is dissipated from a heat sink.

When the heat carried by the electrons reaches the junction of the thermoelectric element 11 and the electrically conductive heat-dissipating layer 15, the heat spreads quickly through the in-plane electrically conductive heat-dissipating layer 15, whose thermal conductivity is greater than 300 W/mK. At the same time, the electrically conductive heat-dissipating layer 15 allows the phonons to pass through and reach the second electrode 14, thus avoids the phonons flowing back to the thermoelectric element 11 due to the temperature difference. Moreover, reduced overall thermal conductivity of the thermoelectric conversion structure 10 contributed by low thermal conductivity (less than 0.1 W/mK) of the electrically conductive heat-blocking layer 13 may alleviate reverse heat-conduction.

In other embodiment of the disclosure, for example, the thermoelectric element 11 is made of P-type semiconductors. A voltage difference, with a high voltage level applied to the first electrode 12 and a low voltage level applied to the second electrode 14, induces a voltage drop between these two electrodes (the voltage level of the first electrode 12 is greater than that of the second electrode 14) and establishes an electric field which causes the net flow of holes flowing from the first electrode 12 to the thermoelectric element 11, then to the second electrode 14. Such a hole current, at the same time, transfers heat from the first electrode 12 to the thermoelectric element 11, then to the second electrode 14 accordingly. Consequently, the heat from the heat source is transferred by the hole current from the first electrode 12 to the thermoelectric element 11, continuing moving to the second electrode 14 and eventually is dissipated from the heat sink.

When the heat carried by the hole reaches the junction of the thermoelectric element 11 and the electrically conductive heat-dissipating layer 15, the thermal heat spreads quickly through the in-plane electrically conductive heat-dissipating layer 15, whose thermal conductivity is greater than 300 W/mK. At the same time, the electrically conductive heat-dissipating layer 15 allows the phonons to pass through and reach the second electrode 14, thus avoids the phonons flowing back to the thermoelectric element 11 due to the temperature difference. Moreover, reduced overall thermal conductivity of the thermoelectric conversion structure 10 contributed by low thermal conductivity (less than 0.1 W/mK) of the electrically conductive heat-blocking layer 13 may alleviate reverse heat-conduction.

Figure 5A:
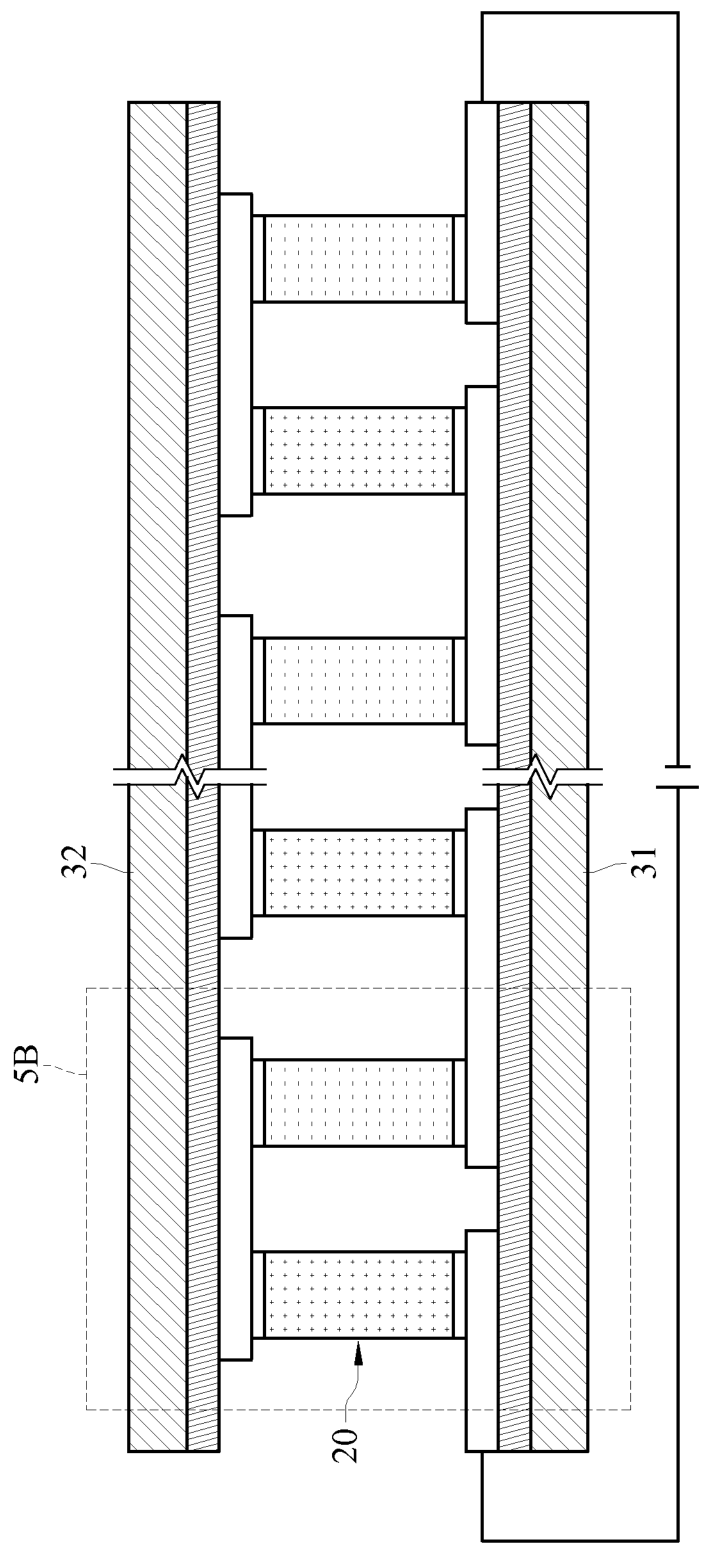
FIG. 5A is a cross-sectional view of a heat dissipation device according to an embodiment of the disclosure.

Please refer to FIG. 5A, which is a cross-sectional view of a heat dissipation device according to the disclosure. The thermoelectric conversion structure which is disclosed in FIGS. 1 to 2D may be applied in a heat dissipation device described hereinafter. The heat dissipation device comprises an array of heat dissipation assemblies 20 which are connected electrically to each other in series and thermally in parallel together, wherein heat is transferred from a heat source 31 to a heat sink 32. The heat dissipation assemblies 20 will be described in detail below.

Figure 5B:
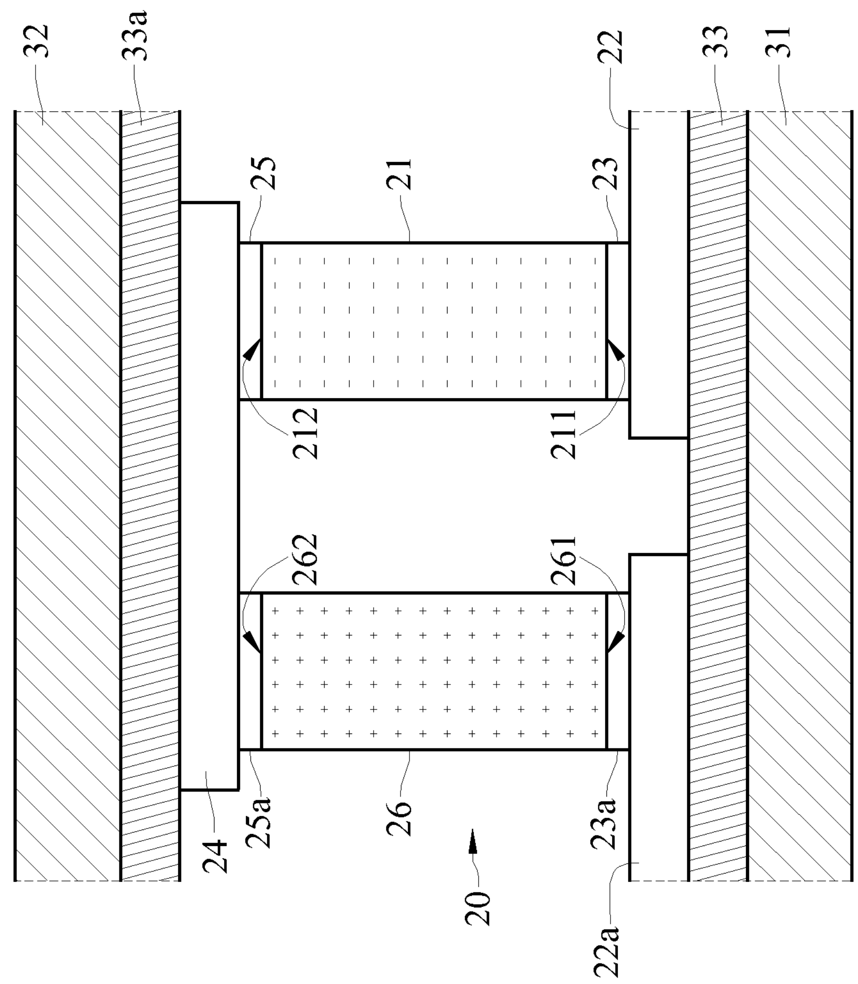
FIG. 5B is an enlarged partial cross-sectional view of the heat dissipation device in FIG. 5A.

Please refer to FIG. 5B, which is an enlarged partial cross-sectional view of the heat dissipation device in FIG. 5A. The heat dissipation assembly 20 comprises a first thermoelectric element 21, a second thermoelectric element 26, two first electrodes 22, *22a*, a second electrode 24, two electrically conductive heat-blocking layers 23, *23a*, and two electrically conductive heat dissipating layers 25, *25a*. The first thermoelectric element 21 is adjacent to the second thermoelectric element 26 side by side in parallel. The first thermoelectric element 21 has a first endothermic end 211 and a first exothermic end 212 which are opposite to each other. Furthermore, the second thermoelectric element 26 has a second endothermic end 261 and a second exothermic end 262 which are opposite to each other. The first electrode 22 is connected to the first endothermic end 211, and the first electrode *22a* is connected to the second endothermic end 261. The second electrode 24 is connected to both the first exothermic end 212 and the second exothermic end 262. The electrically conductive heat-blocking layer 23 is between (namely, sandwiched between) the first thermoelectric element 21 and the first electrode 22. The electrically conductive heat-blocking layer *23a* is between (namely, sandwiched between) the second thermoelectric element 26 and the first electrode *22a*.

In this embodiment of the disclosure, the first electrodes 22, *22a* are attached to the heat source 31 to remove heat from the heat source 31. A thermally conductive dielectric layer 33 is placed between the heat source 31 and both the first electrodes 22, *22a*. The thermally conductive dielectric layer 33 may be omitted if the junction of the heat source 31 and the first electrode 22 and that of the heat source 31 and the first electrode *22a* are both electrically isolated. The second electrode 24 is attached to the heat sink 32 for discharging the heat. A thermally conductive dielectric layer *33a* may be placed between the second electrode 24 and the heat sink 32. If the junction of the heat sink 32 and the second electrode 24 is electrically isolated, the thermally conductive dielectric layer *33a* may not be placed.

In this disclosure, the material of the thermally conductive dielectric layer 33 is a ceramic substrate, metallic compounds, non-metallic compounds, or polymer according to different process conditions, but is not limited to the disclosure.

The first thermoelectric element 21 and the second thermoelectric element 26 have a different polarity, respectively. The first thermoelectric element 21 is located between the first electrode 22 and the second electrode 24. The electrically conductive heat-blocking layer 23 is between (namely, sandwiched between) the first electrode 22 and the first thermoelectric element 21. The second thermoelectric element 26 is located between the first electrode 22*a* and the second electrode 24. The electrically conductive heat-blocking layer 23*a* is between (namely, sandwiched between) the first electrode 22*a* and the second thermoelectric element 26. The configurations of the electrically conductive heat-blocking layers 23 and 23*a* are similar to those of the electrically conductive heat-blocking layers 13, 13*b*, 13*c*, 13*d* described in FIGS. 1, 2A to 2D, and will not be explained again. The materials, number of layers, thickness, and producing methods for the electrically conductive heat-blocking layers 23, 23*a* may be identical or different. An electrically conductive heat-dissipating layer 25 is between (namely, sandwiched between) the first thermoelectric element 21 and the second electrode 24 as well as the electrically conductive heat-dissipating layer 25*a* is between (namely, sandwiched between) the second thermoelectric element 26 and the second electrode 24. The configurations of the electrically conductive heat-dissipating layers 25, 25*a* are similar to that of the electrically conductive heat-blocking layer 15 described in FIG. 1, and will not be repeated again.

In the embodiment of the disclosure, the first thermoelectric element 21 is made of N-type semiconductors and the second thermoelectric element 26 is made of P-type semiconductors, but not limited to the disclosure. In other embodiments, the first thermoelectric element 21 is made of P-type semiconductors and the second thermoelectric element 26 is made of N-type semiconductors. The materials of the first electrode 22, the first electrode 22*a* and the second electrode 24 are selected from a group consisting of platinum, gold, nickel, palladium, copper, aluminum, silver, titanium, tantalum, tungsten, molybdenum, chromium, cobalt, iron, zirconium, hafnium, vanadium, iridium, platinum alloys, gold alloys, nickel alloys, palladium alloys, copper alloys, aluminum alloys, silver alloys, titanium, tantalum alloys, tungsten alloys, molybdenum alloys, chromium alloys, cobalt alloys, ferroalloys, zirconium alloys, hafnium alloys, vanadium alloys, iridium and combinations thereof. In addition, the first electrode 22, the first electrode 22*a* and the second electrode 24 may be formed of identical or dissimilar materials. The methods for producing the first electrode 22, the first electrode 22*a* and the second electrode 24 in the embodiment may be identical or dissimilar, and include PVD, CVD, ALD and plating, but not limited to the disclosure.

In the embodiment of the disclosure, electrons may tunnel through the electrically conductive heat-blocking layers 23, 23*a* without being blocked, thus the electrical conductivity of the heat dissipation assembly 20 is unaffected. When the thickness of the electrically conductive heat-blocking layers 23, 23*a* are less than or close to the phonon mean free path, phonons will be scattered at the interface of the electrically conductive heat-blocking layers 23, 23*a* so that the overall thermal conductivity of the heat dissipation assembly 20 is reduced. Therefore, in the disclosure, the figure of merit ZT of the heat dissipation assembly 20 is increased by means of maintaining the electrical conductivity and reducing the thermal conductivity.

In the embodiment of the disclosure, the materials of the electrically conductive heat-dissipating layers 25, 25*a*, whose thickness are less than 100 nm, are selected from a group consisting of graphene, carbon nanotube, carbon nanowire and combinations thereof, but not limited to the disclosure. In other embodiment, the material of the electrically conductive heat-dissipating layers 25, 25*a* is even single-layer graphene. Methods for producing the electrically conductive heat-dissipating layers 25, 25*a* in the embodiment are CVD, mechanical exfoliation method, epitaxial growth method, and chemical reduction method of graphene oxide, but not limited to the disclosure. The materials, number of layers, thickness, and producing methods of the electrically conductive heat-dissipating layers 25, 25*a* may be identical or different. When the first thermoelectric element 21 and the second thermoelectric element 26 are commonly connected to the shared second electrode 24, in other embodiments of the disclosure, the amount of the electrically conductive heat-dissipating layer is one (i.e., the electrically conductive heat-dissipating layers 25, 25*a* are integrated into one piece), one side of the electrically conductive heat-dissipating layer is connected to the second electrode 24, and the opposite of the electrically conductive heat-dissipating layer is connected to both the first thermoelectric element 21 and the second thermoelectric element 26.

For example, in the embodiment of the disclosure, the first thermoelectric element 21 is made of N-type semiconductors while the second thermoelectric element 26 is made of P-type semiconductors. When the heat dissipation assembly 20 is operated, a voltage difference, with a low voltage level applied to the first electrode 22 and the high voltage level to the first electrode 22*a*, makes the voltage level of the first electrode 22 lower than that of the first electrode 22*a*, and creates a closed electrical circuit of the first electrode 22*a*, the second thermoelectric element 26, the second electrode 24, the first thermoelectric element 21 and the first electrode 22.

As illustrated in the right side of FIG. 5B, electron current flows from the first electrode 22 to the first thermoelectric element 21, continuing flowing to the second electrode 24, at the same time, carrying heat from the first electrode 22 to the first thermoelectric element 21, and continuing flowing to the second electrode 24 accordingly. Afterwards, the heat from the right part of the heat source 31 is transferred from the first electrode 22 to the first thermoelectric element 21, then continuously to the second electrode 24 and the heat sink 32 through the electron current, and is eventually released by the heat sink 32. As illustrated in the left side of FIG. 5B, hole current flows from the first electrode 22*a* to the second thermoelectric element 26, then continues to the second electrode 24. At the same time, the hole current carries the heat from the first electrode 22*a* to the second thermoelectric element 26, then continuously to the second electrode 24 accordingly. As a result, the heat from the left part of the heat source 31 is transferred from the first electrode 22*a* to the second thermoelectric element 26, then continuously to the second electrode 24 and the heat sink 32 through the hole current, and is eventually released by the heat sink 32.

When the heat carried by the carriers reaches the junction of the first thermoelectric element 21 and the electrically conductive heat-dissipating layer 25 as well as the junction of the second thermoelectric element 26 and the electrically conductive heat-dissipating layer 25*a*, the thermal heat spreads quickly through the in-plane electrically conductive heat-dissipating layers 25, 25*a*, whose thermal conductivities are greater than 300 W/mK. At the same time, the electrically conductive heat-dissipating layers 25, 25*a* allow the phonons to pass through and reach the second electrode 24, thus avoid the phonons flowing back to the first thermoelectric element 21 and the second thermoelectric element 26 due to the temperature difference. Moreover, reduced overall thermal conductivity of the heat dissipation assembly 20 contributed by low thermal conductivity (less than 0.1 W/mK) of the electrically conductive heat-blocking layers 23 and 23*a* may alleviate reverse heat-conduction.

In the disclosure, the oxides include silicon oxide, but not limited to the disclosure. The nitrides include silicon nitride, but not limited to the disclosure. The oxynitrides include silicon oxynitrides, but not limited to the disclosure. The carbides include silicon carbide and silicon nitride carbide, but not limited to the disclosure. The carbon oxides include graphene oxide and oxycarbide, but not limited to the disclosure. The metal carbides include titanium carbide, hafnium carbide, zirconium carbide, tantalum carbide, vanadium carbide, niobium carbide, chromium carbide, molybdenum carbide, and tungsten carbide, but not limited to the disclosure. The metal nitrides include titanium nitride, tantalum nitride, platinum nitride, tungsten nitride, molybdenum nitride, zirconium nitride, chromium nitride, copper nitride, zinc nitride, and iron nitride, but not limited to the disclosure. The metal silicides include nickel silicide, platinum silicide, tantalum silicide, titanium silicide, tungsten silicide, cobalt silicide, molybdenum silicide, iron silicide, manganese silicide, hafnium silicide and gold silicide, but not limited to the disclosure. The metal nitride silicides include tantalum nitride silicide, but not limited to the disclosure. The metal carbon silicides include titanium carbon silicide, but not limited to the disclosure. The metal oxides include hafnium oxide, titanium oxide, tantalum oxide, aluminum oxide, yttrium oxide, indium oxide, vanadium oxide, lanthanum oxide, and zirconium oxide, but not limited to the disclosure. The metal nitride oxides include hafnium nitride oxide, tantalum nitride oxide, aluminum tantalum nitride oxide, aluminum nitride oxide, and titanium nitride oxide, but not limited to the disclosure.

In summary, the electrically conductive heat-blocking layer having a specific thickness allows the electrons to tunnel through so that the electrical conductivity of the thermoelectric conversion structure and its use as the heat dissipation device is maintained. The overall thermal conductivity of the heat dissipation device is reduced because the electrically conductive heat-blocking layers block the transmission of the phonons. Moreover, the rapid heat transmission capability of the electrically conductive heat-dissipating layer prevents the heat, transferred to the junction of the thermoelectric element and the electrically conductive heat-dissipating layer, from heat reflux (i.e., heat reflow). The temperature of the first electrode of the disclosure may be decreased faster and lower and, as a result, the thermoelectric conversion efficiency of the thermoelectric heat dissipation device is increased.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A thermoelectric conversion structure, comprising:

a thermoelectric element which includes a first end and a second end opposite to each other;

a first electrode which is located at the first end of the thermoelectric element; and an electrically conductive heat-blocking layer which is between the thermoelectric element and the first electrode and directly contacts the first end of the thermoelectric element, wherein the range of the thickness ratio of the thermoelectric element to the electrically conductive heat-blocking layer is 100 to 10000;

a second electrode, which is located at the second end of the thermoelectric element; and an electrically conductive heat-dissipating layer, which is between the thermoelectric element and the second electrode and directly contacts the second end of the thermoelectric element, wherein materials of the electrically conductive heat-blocking layer and the electrically conductive heat-dissipating layer respectively directly contacting the first end and the second end of the thermoelectric element are different, a thermal conductivity of the electrically conductive heat-dissipating layer is greater than 300 W/mK, and a thermal conductivity of the electrically conductive heat-blocking layer is less than 0.1 W/mK.

2. The thermoelectric conversion structure according to claim 1, wherein the first end of the thermoelectric element is an endothermic end, and the second end of the thermoelectric element is an exothermic end.

3. The thermoelectric conversion structure according to claim 1, wherein the electrically conductive heat-blocking layer comprises at least one first sublayer, which is formed of the material selected from a group consisting of oxides, metal oxides, nitrides, oxynitrides, metal nitride oxides, carbides, carbon oxides and combinations thereof.

4. The thermoelectric conversion structure according to claim 3, wherein the total thickness of the first sublayer is less than 10 nm.

5. The thermoelectric conversion structure according to claim 3, wherein the electrically conductive heat-blocking layer comprises a plurality of first sublayers, and wherein the materials of the least two of the plurality of first sublayers are different from each other.

6. The thermoelectric conversion structure according to claim 1, wherein the electrically conductive heat-blocking layer comprises:

at least one first sublayer, which is formed of the material selected from a group consisting of oxides, metal oxides, nitrides, oxynitrides, metal nitride oxides, carbides, carbon oxides and combinations thereof; and at least one second sublayer, which is formed of the material selected from a group consisting of metal silicides, metal nitrides, metal nitride silicides, metal carbides, metal carbon silicides, amorphous alloys and combinations thereof.

7. The thermoelectric conversion structure according to claim 6, wherein the thickness of the first sublayer is less than 10 nm, and the thickness of the second sublayer is less than 100 nm.

8. The thermoelectric conversion structure according to claim 6, wherein the electrically conductive heat-blocking layer comprises the plurality of first sublayers, and wherein the materials of the least two of the plurality of first sublayers are different from each other.

9. The thermoelectric conversion structure according to claim 6, wherein the at least one first sublayer of the electrically conductive heat-blocking layer comprise oxides and the at least one second sublayer of the electrically conductive heat-blocking layer comprises nitrides.

10. The thermoelectric conversion structure according to claim 6, wherein the at least one first sublayer of the electrically conductive heat-blocking layer comprises one first sublayer disposed on a first side of the at least one second sublayer and another first sublayer disposed on a second side of the at least one second sublayer, the second side being opposite the first side.

11. The thermoelectric conversion structure according to claim 10, wherein the one first sublayer and another first sublayer comprise the same material.

12. The thermoelectric conversion structure according to claim 10, wherein the one first sublayer and another first sublayer comprise different materials.

13. The thermoelectric conversion structure according to claim 10, wherein the one first sublayer material is selected from a group comprising one of oxides, metal oxides, nitrides, oxynitrides, metals nitride oxides, carbides, and carbon oxides, and wherein the another first sublayer material is selected from a group comprising another one of oxides, metal oxides, nitrides, oxynitrides, metals nitride oxides, carbides, and carbon oxides.

14. The thermoelectric conversion structure according to claim 10, wherein a thickness of the one first sublayer is less than 10 nm, a thickness of the another one first sublayer is less than 10 nm, and a thickness of the second sublayer is less than 100 nm.

15. The thermoelectric conversion structure according to claim 1, wherein the material of the first electrode is selected from a group consisting of platinum, gold, nickel, palladium, copper, aluminum, silver, titanium, tantalum, tungsten, molybdenum, chromium, cobalt, iron, zirconium, hafnium, vanadium, iridium, platinum alloys, gold alloys, nickel alloys, palladium alloys, copper alloys, aluminum alloys, silver alloys, titanium alloys, tantalum alloys, tungsten alloys, molybdenum alloys, chromium alloys, cobalt alloys, ferroalloys, zirconium alloys, hafnium alloys, vanadium alloys, iridium alloys and combinations thereof.

16. The thermoelectric conversion structure according to claim 1, wherein the material of the electrically conductive heat-dissipating layer is selected from a group consisting of graphene, carbon nanotube, carbon nanowire and combinations thereof.

17. The thermoelectric conversion structure according to claim 1, wherein the material of the second electrode is selected from a group consisting of platinum, gold, nickel, palladium, copper, aluminum, silver, titanium, tantalum, tungsten, molybdenum, chromium, cobalt, iron, zirconium, hafnium, vanadium, iridium, platinum alloys, gold alloys, nickel alloys, palladium alloys, copper alloys, aluminum alloys, silver alloys, titanium alloys, tantalum alloys, tungsten alloys, molybdenum alloys, chromium alloys, cobalt alloys, ferroalloys, zirconium alloys, hafnium alloys, vanadium alloys, iridium alloys and combinations thereof.

18. The thermoelectric conversion structure according to claim 1, wherein a thickness of the electrically conductive heat-blocking layer is less than a phonon mean free path.

* * * * *